(12) United States Patent
Stollberg

(10) Patent No.: US 8,022,601 B2
(45) Date of Patent: Sep. 20, 2011

(54) PIEZOELECTRIC-COATED CARBON NANOTUBE GENERATORS

(75) Inventor: David W. Stollberg, Acworth, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 315 days.

(21) Appl. No.: 12/405,296

(22) Filed: Mar. 17, 2009

(65) Prior Publication Data

US 2009/0309456 A1 Dec. 17, 2009

Related U.S. Application Data

(60) Provisional application No. 61/037,168, filed on Mar. 17, 2008.

(51) Int. Cl.
H01L 41/113 (2006.01)

(52) U.S. Cl. .......... 310/339; 310/365

(58) Field of Classification Search .......... 310/339, 310/365, 366
See application file for complete search history.

(56) References Cited

U.S. PATENT DOCUMENTS

| | | |
|---|---|---|
| 4,099,986 A | 7/1978 | Diepers |
| 4,135,950 A | 1/1979 | Rittner |
| 4,155,781 A | 5/1979 | Diepers |
| 4,352,948 A | 10/1982 | Kaplow et al. |
| 4,450,033 A | 5/1984 | Little |
| 4,748,130 A | 5/1988 | Wenham et al. |
| 6,559,550 B2 | 5/2003 | Herman |
| 6,882,051 B2 | 4/2005 | Majumdar et al. |
| 7,047,800 B2 | 5/2006 | Thiesen et al. |
| 7,051,945 B2 | 5/2006 | Empedocles et al. |
| 7,262,515 B2 | 8/2007 | Pinkerton |
| 7,294,417 B2 | 11/2007 | Ren et al. |
| 2002/0172820 A1 | 11/2002 | Majumdar et al. |
| 2003/0089899 A1 | 5/2003 | Lieber et al. |
| 2003/0205657 A1 | 11/2003 | Voisin |
| 2004/0127025 A1 | 7/2004 | Crocker, Jr. et al. |
| 2004/0133092 A1 | 7/2004 | Kain |
| 2005/0009224 A1 | 1/2005 | Yang et al. |
| 2005/0188751 A1 | 9/2005 | Puskas |
| 2005/0242366 A1 | 11/2005 | Parikh et al. |

(Continued)

FOREIGN PATENT DOCUMENTS

DE 102005029162 A1 1/2007

(Continued)

*Primary Examiner* — Derek Rosenau
(74) *Attorney, Agent, or Firm* — Bryan W. Bockhop; Bockhop & Associates, LLC

(57) ABSTRACT

A generator includes a first conductive layer, a plurality of elongated piezoelectric nanostructures and a conductive electrode. The piezoelectric nanostructures extend upwardly from the first conductive layer and include a carbon nanotube core and a piezoelectric sheath enveloping at least a portion of the carbon nanotube core. Each piezoelectric nanostructure includes a first end disposed adjacent to the first conductive layer and an opposite second end. The conductive electrode is disposed adjacent to the second end of each of the piezoelectric nanostructures. The conductive electrode is configured so that a Schottky barrier is formed between the second end of at least one of the piezoelectric nanostructures and the conductive electrode when a force is applied to the generator that causes the conductive electrode to touch the piezoelectric nanostructures and to induce stress in the piezoelectric nanostructures.

21 Claims, 2 Drawing Sheets

U.S. PATENT DOCUMENTS

| | | |
|---|---|---|
| 2006/0119221 A1* | 6/2006 | Ikeda et al. .................. 310/332 |
| 2006/0137741 A1 | 6/2006 | Park et al. |
| 2007/0010702 A1 | 1/2007 | Wang et al. |
| 2007/0111368 A1 | 5/2007 | Zhang et al. |
| 2007/0151601 A1 | 7/2007 | Jung et al. |
| 2008/0041446 A1 | 2/2008 | Wu et al. |
| 2008/0067618 A1 | 3/2008 | Wang et al. |
| 2008/0161796 A1 | 7/2008 | Cao et al. |

FOREIGN PATENT DOCUMENTS

| | | |
|---|---|---|
| EP | 1523019 A2 | 4/2005 |
| WO | 2006138671 A2 | 12/2006 |

* cited by examiner

PIEZOELECTRIC-COATED CARBON NANOTUBE GENERATORS

CROSS-REFERENCE TO RELATED APPLICATION(S)

This application claims the benefit of U.S. Provisional Patent Application Ser. No. 61/037,168, filed Mar. 17, 2008, the entirety of which is hereby incorporated herein by reference.

BACKGROUND OF THE INVENTION

1. Field of the Invention

The present invention relates to power generators and, more specifically, to a nanoscale power generator.

2. Description of the Prior Art

A Schottky barrier is a metal-semiconductor junction that rectifies current and, thus, may be used as a diode. A metal-semiconductor junction that does not rectify current is called an Ohmic contact. The rectifying properties of a metal-semiconductor junction depend on the metal's work function, the band gap of the intrinsic semiconductor, and the type and concentration of dopants in the semiconductor.

A piezoelectric material is one that forms an electrical potential difference between two regions of the material when the material is subjected to uneven mechanical forces. For example, when certain piezoelectric materials are bent, they develop a positive voltage in one region and a negative voltage in another region.

Many micro-scale and nano-scale machines have been proposed for such uses as in vitro medical devices. However, most of these machines are limited by the size of the power source that drives them. Specifically, many such designs rely on chemical batteries to supply electrical power to the devices. Therefore, they can be no smaller than the battery used and are useful only so long as the battery is able to provide power.

However, some of such devices need to be operational for long periods, rather than be limited by the lifespan of a battery. Also, it may be extremely difficult to change the batteries in some devices, such as environmental sensors.

In response to these problems, zinc oxide nanowires have been used to generate electricity. However, zinc oxide nanowires by themselves tend to be brittle and have a limited maximum length. This results in limited power generation and a relatively short service life.

Therefore, there is a need for a nanoscale power generation system that has improved power generation and service life.

SUMMARY OF THE INVENTION

The disadvantages of the prior art are overcome by the present invention which, in one aspect, is a generator that includes a first conductive layer, a plurality of elongated piezoelectric nanostructures and a conductive electrode. The plurality of elongated piezoelectric nanostructures extends upwardly from the first conductive layer. The plurality of elongated piezoelectric nanostructures includes a carbon nanotube core and a piezoelectric sheath enveloping at least a portion of the carbon nanotube core. Each of the plurality of elongated piezoelectric nanostructures includes a first end disposed adjacent to the first conductive layer and an opposite second end. The conductive electrode is disposed adjacent to the second end of each of the plurality of elongated piezoelectric nanostructures. The conductive electrode is configured so that a Schottky barrier is formed between the second end of at least one of the plurality of elongated piezoelectric nanostructures and the conductive electrode when a force is applied to the generator that causes the conductive electrode to touch the plurality of elongated piezoelectric nanostructures and to induce stress in the plurality of elongated piezoelectric nanostructures.

In another aspect, the invention is a method of making a generator, in which a first plurality of carbon nanotubes is grown from a first conductive layer. A piezoelectric sheath is grown about a portion of each of the first plurality of carbon nanotubes. A conductive electrode is generated and the conductive electrode is disposed opposite the first plurality of carbon nanotubes. When the conductive electrode engages the piezoelectric sheath enveloping at least one of the nanotubes, a Schottky barrier is formed therebetween.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
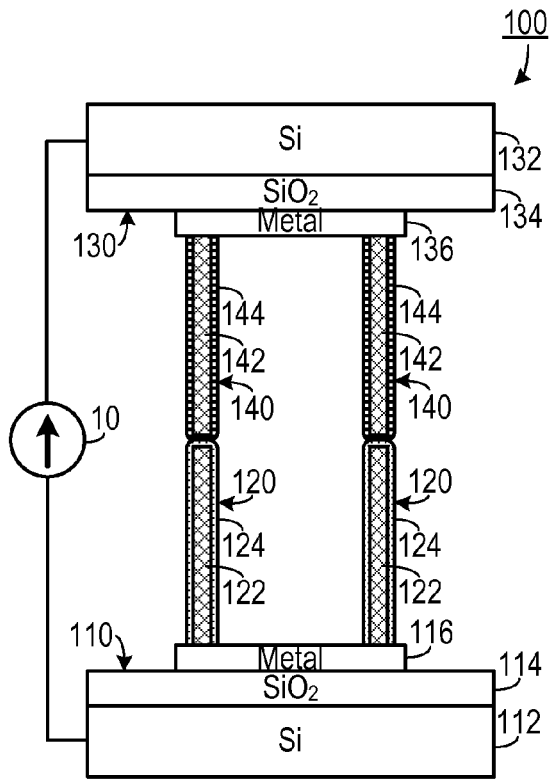
FIGS. 1A-1B are schematic diagrams of a first embodiment of a piezoelectric-coated carbon nanotube generator system.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Methods of generating nanostructures used in nanoscale generators are disclosed in U.S. patent application Ser. No. 11/760,002, filed on Jun. 8, 2007, which is incorporated herein by reference.

As shown in FIG. 1, one representative embodiment of the invention is a generator 100 that includes a piezoelectric member 110 and an electrode member 130. The piezoelectric member 110 includes a conductive substrate 112, such as a silicon layer upon which may be disposed a silicon dioxide layer 114. Upon the conductive substrate is a conductive metal layer 116 that is used as a seed material from which a plurality of elongated carbon nanotubes 122 is grown. In one embodiment, the conductive metal layer includes iron. A piezoelectric sheath 124 surrounds each of the carbon nanotubes 122 to form a plurality of elongated piezoelectric nanostructures 120 extending from the conductive substrate 112. In one embodiment, the piezoelectric sheath 124 includes zinc oxide (although other piezoelectric materials could also be used, depending on the specific application). The carbon nanotubes 122 are extremely strong and, therefore, provide support for the piezoelectric sheath 124 thereby allowing relatively long piezoelectric nanostructures to be employed in the generator 100.

The electrode member 130 is disposed oppositely from the piezoelectric member 110. In one embodiment, the electrode member 130 includes a conductive substrate 132, such as a silicon layer upon which may be disposed a silicon dioxide layer 134 (in some embodiments, the silicon dioxide layer 134 is merely an artifact of the fabrication process and can be removed). Upon the conductive substrate is a conductive metal layer 136 that is used as a seed material from which a plurality of elongated carbon nanotubes 142 is grown. A conductive sheath 144 surrounds each of the carbon nanotubes 142 to form a plurality of plurality of conductive structures 140 extending from the conductive substrate 132. In one embodiment, the metal layer 136 includes iron and the conductive sheath 144 includes a metal such as gold (although other metals could be used, depending on the specific application).

Figure 1B:
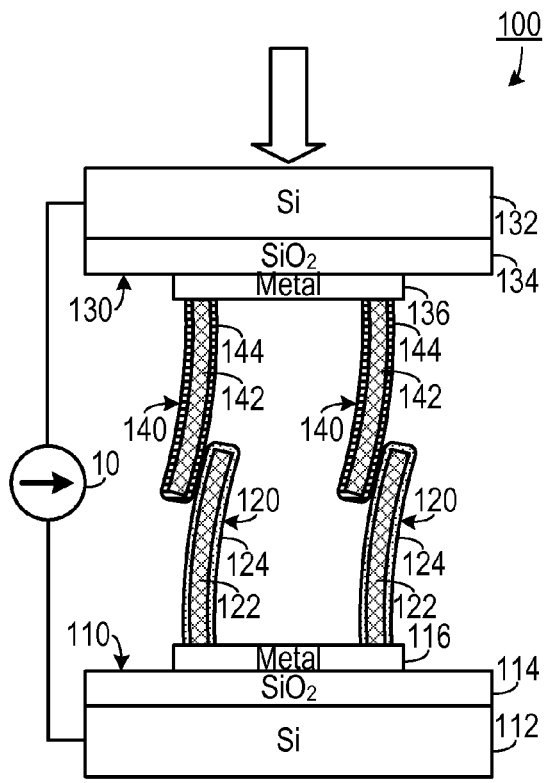

As shown in FIG. 1B, when a force is applied to the generator 100, a potential difference will form across the elongated piezoelectric nanostructures 120 and a Schottky barrier will form between the elongated piezoelectric nanostructures 120 and the conductive structures 140, thereby causing charge to flow in a single direction. This is evidenced by a change of electrical state in a load 10 coupled between the piezoelectric member 110 and the electrode member 130.

Figure 2:
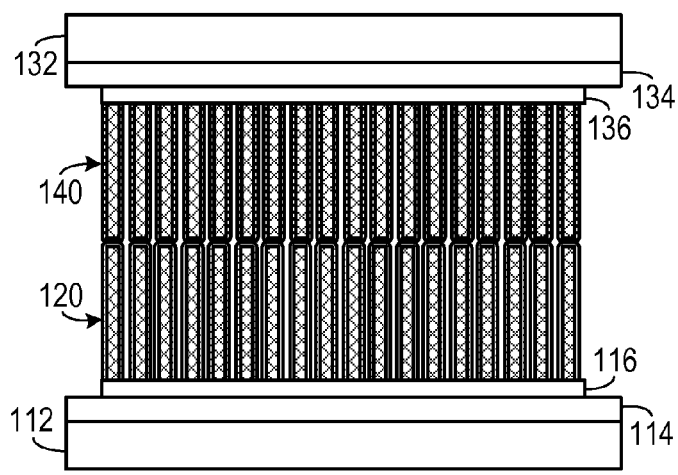
FIG. 2 is a schematic diagram of a second embodiment of a piezoelectric-coated carbon nanotube generator system.

A typical embodiment is shown in FIG. 2, in which many elongated piezoelectric nanostructures 120 and the conductive structures 140 are used to increase the current output of the generator. These structures could also be stacked and coupled in series to increase the voltage output.

Figure 3:
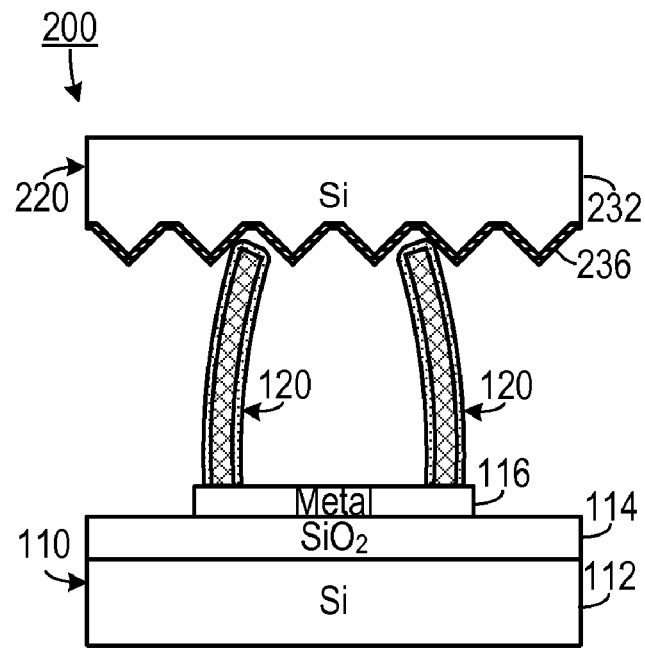
FIG. 3 is a schematic diagram of a third embodiment of a piezoelectric-coated carbon nanotube generator system.

An alternate embodiment of a generator 200 employing a corrugated conductive nanostructure 220 is shown in FIG. 3. In this embodiment, a corrugated surface is etched into a silicon substrate 232 using well known photolithographic methods and the corrugated surface is covered with a metallic layer 236, such as gold.

Figure 4:
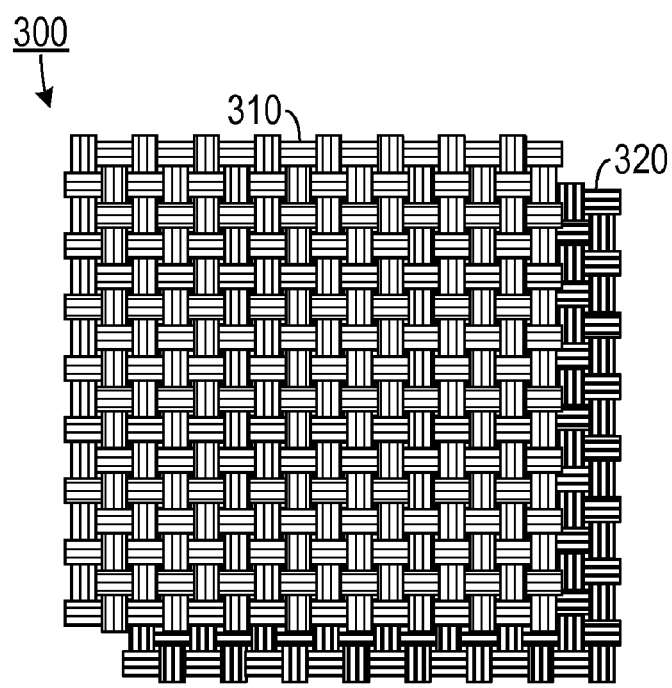
FIG. 4 is a schematic diagram of a fourth embodiment of a piezoelectric-coated carbon nanotube generator system.

Another alternate embodiment of a generator 300 is shown in FIG. 4. In this embodiment, a first woven carbon fiber mesh 310 is used as the substrate from which the plurality of elongated piezoelectric nanostructures 120 is grown and a second woven carbon fiber mesh 320 is used as the substrate from which the plurality of conductive structures 140 is grown. This embodiment could be incorporated into fabrics and shoe soles and used to recharge batteries for people whose jobs require a constant power source (e.g., soldiers, miners, etc.)

In one method of making a generator, carbon nanotubes are grown from a metal seed layer (such as iron) using chemical vapor deposition or one of the other well know methods of growing carbon nanotubes. The piezoelectric sheath may be added to the carbon nanotubes through such well known methods as: sputtering, evaporation, molecular beam epitaxy and ion-assisted deposition (or with other known to the art, such as: chemical vapor deposition, sol-gel, physical vapor deposition, etc.) Coating of the carbon nanotubes in the electrode member with a conductive metal layer can be accomplished through such methods as metal evaporation and sputtering.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A generator, comprising:
    a. a first conductive layer;
    b. a plurality of elongated piezoelectric nanostructures extending upwardly from the first conductive layer, the plurality of elongated piezoelectric nanostructures including a carbon nanotube core and a piezoelectric sheath enveloping at least a portion of the carbon nanotube core, each of the plurality of elongated piezoelectric nanostructures including a first end disposed adjacent to the first conductive layer and an opposite second end; and
    c. a conductive electrode disposed adjacent to the second end of each of the plurality of elongated piezoelectric nanostructures, the conductive electrode configured so that a Schottky barrier is formed between the second end of at least one of the plurality of elongated piezoelectric nanostructures and the conductive electrode when a force is applied to the generator that causes the conductive electrode to touch the plurality of elongated piezoelectric nanostructures and to induce stress in the plurality of elongated piezoelectric nanostructures.

2. The generator of claim 1, wherein the piezoelectric sheath comprises zinc oxide.

3. The generator of claim 1, wherein the first conductive layer comprises a first metal.

4. The generator of claim 3, wherein the first metal comprises iron.

5. The generator of claim 1, further comprising a substrate disposed against the first conductive layer and opposite from the plurality of elongated piezoelectric nanostructures.

6. The generator of claim 1, further comprising a silicon layer disposed adjacent to the first conductive layer.

7. The generator of claim 1, wherein the conductive electrode comprises:
    a. a second conductive layer;
    b. a plurality of carbon nanotubes extending away from the second conductive layer; and
    c. a conductive sheath disposed about at least a portion of each of the plurality of carbon nanotubes.

8. The generator of claim 7, wherein the conductive sheath comprises gold.

9. The generator of claim 1, wherein the conductive electrode comprises:
    a. a substrate with a corrugated surface; and
    b. a metallic layer disposed adjacent to the corrugated surface.

10. The generator of claim 9, wherein the metallic layer comprises gold.

11. The generator of claim 1, wherein the first conductive layer comprises a first woven carbon fiber mesh and wherein the conductive electrode comprises a second woven carbon fiber mesh from which a second plurality of carbon nanotubes extend, a conductive sheath enveloping at least a portion of each of the second plurality of carbon nanotubes.

12. The generator of claim 11, wherein the conductive sheath comprises gold.

13. A generator, comprising:
    a. a first conductive layer;
    b. a plurality of elongated piezoelectric nanostructures extending upwardly from the first conductive layer, the plurality of elongated piezoelectric nanostructures including a carbon nanotube core and a piezoelectric sheath enveloping at least a portion of the carbon nanotube core, each of the plurality of elongated piezoelectric nanostructures including a first end disposed adjacent to the first conductive layer and an opposite second end; and c. a conductive electrode disposed adjacent to the second end of each of the plurality of elongated piezoelectric nanostructures, the conductive electrode configured so that a Schottky barrier is formed between the second end of at least one of the plurality of elongated piezoelectric nanostructures and the conductive electrode when a force is applied to the generator that causes the conductive electrode to touch the plurality of elongated piezoelectric nanostructures and to induce stress in the plurality of elongated piezoelectric nanostructures, wherein the conductive electrode includes:
  i. a second conductive layer;
  ii. a plurality of carbon nanotubes extending away from the second conductive layer; and
  iii. a conductive sheath disposed about at least a portion of each of the plurality of carbon nanotubes.

14. The generator of claim 13, wherein the conductive sheath comprises gold.

15. The generator of claim 13, wherein the piezoelectric sheath comprises zinc oxide.

16. The generator of claim 13, wherein the first conductive layer comprises a first metal.

17. The generator of claim 13, further comprising a substrate disposed against the first conductive layer and opposite from the plurality of elongated piezoelectric nanostructures.

18. A generator, comprising:
  a. a first conductive layer including a first woven carbon fiber mesh and wherein the conductive electrode includes a second woven carbon fiber mesh from which a second plurality of carbon nanotubes extend, a conductive sheath enveloping at least a portion of each of the second plurality of carbon nanotubes;
  b. a plurality of elongated piezoelectric nanostructures extending upwardly from the first conductive layer, the plurality of elongated piezoelectric nanostructures including a carbon nanotube core and a piezoelectric sheath enveloping at least a portion of the carbon nanotube core, each of the plurality of elongated piezoelectric nanostructures including a first end disposed adjacent to the first conductive layer and an opposite second end; and
  c. a conductive electrode disposed adjacent to the second end of each of the plurality of elongated piezoelectric nanostructures, the conductive electrode configured so that a Schottky barrier is formed between the second end of at least one of the plurality of elongated piezoelectric nanostructures and the conductive electrode when a force is applied to the generator that causes the conductive electrode to touch the plurality of elongated piezoelectric nanostructures and to induce stress in the plurality of elongated piezoelectric nanostructures.

19. The generator of claim 18, wherein the conductive sheath comprises gold.

20. The generator of claim 18, wherein the piezoelectric sheath comprises zinc oxide.

21. The generator of claim 18, further comprising a substrate disposed against the first conductive layer and opposite from the plurality of elongated piezoelectric nanostructures.

* * * * *